United States Patent
Watson et al.

(10) Patent No.: US 6,195,032 B1
(45) Date of Patent: Feb. 27, 2001

(54) TWO-STAGE PIPELINED RECYCLING ANALOG-TO-DIGITAL CONVERTER (ADC)

(75) Inventors: Minh V. Watson, Fremont; Hessam Mohajeri, San Jose, both of CA (US)

(73) Assignee: Centillium Communications, Inc., Fremont, CA (US)

( * ) Notice: Subject to any disclaimer, the term of this patent is extended or adjusted under 35 U.S.C. 154(b) by 0 days.

(21) Appl. No.: 09/373,472

(22) Filed: Aug. 12, 1999

(51) Int. Cl.⁷ .............................. H03M 1/44; H03M 1/14
(52) U.S. Cl. ........................... 341/162; 341/156; 341/163
(58) Field of Search ................................. 341/156, 161, 341/162, 163

(56) References Cited

U.S. PATENT DOCUMENTS

| | | | |
|---|---|---|---|
| 4,814,767 | 3/1989 | Fernandez et al. | 341/158 |
| 5,070,332 | 12/1991 | Kaller et al. | 341/156 |
| 5,184,130 | 2/1993 | Mangelsdorf | 341/156 |
| 5,302,869 | 4/1994 | Hosotani et al. | 307/518 |
| 5,327,129 * | 7/1994 | Soenen | 341/161 |
| 5,387,914 | 2/1995 | Mangelsdorf | 341/156 |
| 5,389,929 | 2/1995 | Nayebi et al. | 341/156 |
| 5,436,629 | 7/1995 | Mangelsdorf | 341/156 |
| 5,459,465 | 10/1995 | Kagey | 341/156 |
| 5,644,313 | 7/1997 | Rakers et al. | 341/163 |
| 5,739,781 | 4/1998 | Kagey | 341/155 |
| 5,861,832 * | 7/1999 | Nagaraj | 341/162 |

OTHER PUBLICATIONS

Cho & Gray, "A 10b, 20 Msample/s 35 mW Pipeline A/D Converter" IEEE JSSC vol. 30, No. 3, Mar. 1995, pp. 166–72.

Yu & Lee, "A 2.5–v, 12–b 5–Msample/s Pipelined CMOS ADC", IEEE JSSC vol. 31 No. 12, Dec. 1996, pp. 1854–1861.

Li, Chin, Gray, & Castello, "A Ratio–Independent Algorithmic Analog–to–Digital Conversion Technique" IEEE JSSC vol. SC–19, No. 6, Dec. 1984, pp. 828–836.

Sutarja & Gray, "A Pipelined 13–bit 250–Ks/s, 5–V Analog–to–digital Converter" IEEE JSSC vol.23, No. 6, Dec. 1988, pp. 1316–1323.

* cited by examiner

Primary Examiner—Howard L. Williams
(74) Attorney, Agent, or Firm—Stuart T. Auvinen

(57) ABSTRACT

An Analog-to-Digital Converter (ADC) contains two pipeline stages that operate in parallel on two different analog samples. Each pipeline stage includes two sub-stages. Each sub-stage has a low-resolution ADC element and a low-resolution DAC element. The ADC element converts the analog voltage input to the sub-stage into B digital bits, where B is a low number such as 1, 1.5, or 2. These digital bits are re-converted back to an analog DAC voltage by the DAC element. A subtractor then subtracts the analog DAC voltage from the sub-stage's analog input voltage to produce a difference voltage that represents the quantization error of the ADC/DAC elements. A multiplying amplifier multiplies the difference voltage by $2^B$ to generate an output voltage to the next sub-stage. Each high-level pipeline stage acts as a recycling ADC, having a feedback switch that connects the output of the last sub-stage to the analog input of the first sub-stage. During successive clock periods, the first sub-stage converts B digital bits during a PH1 phase while the last sub-stage converts another B digital bits of less significance during the PH2 phase. The analog output from the last sub-stage is recycled back to the first sub-stage for the next clock and another 2B bits are converted in the next clock period. Once all of the MSB's have been converted, the last sub-stage outputs an analog residue voltage to the first sub-stage of the second pipeline stage, which then converts the LSB bits over several clock cycles using the same recycling method.

20 Claims, 6 Drawing Sheets

12-BIT ADC
B=C=1, N=M=6

TWO-STAGE PIPELINED RECYCLING ANALOG-TO-DIGITAL CONVERTER (ADC)

FIELD OF THE INVENTION

This invention relates to Analog-to-Digital converters (ADCs), and more particularly to multi-stage, pipelined recycling ADCs.

BACKGROUND OF THE INVENTION

Digital signal processing has been an enabling technology for high-speed telephony. Digital-Subscriber Lines (DSL) use highly-complex digital processing for line coding, data compression, and error correction. However, signals transmitted over the copper-pair telephone lines are analog signals. Conversion between the analog telephone signal and digital words is thus a critical piece of DSL systems.

Many kinds of Analog-to-Digital Converters (ADC's) have been used for a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

Many interesting variations of these basic ADC types have been disclosed. See U.S. Pat. No. 5,459,465 by Kagey, U.S. Pat. No. 5,302,869 by Hosotani et al., and U.S. Pat. No. 5,436,629 by Mangseldorf.

FIG. 1 shows a prior-art pipelined ADC. See "A 2.5-v, 12-b 5-Msample/s Pipelined CMOS ADC", by Yu and Lee, IEEE Journal of Solid-State Circuits, Vol. 31, No. 12, December 1996, pp. 1854–61. Two stages 10, 10' are shown of the pipeline. Each stage 10, 10' converts its analog input to B digital bits. Sample-and-hold amplifier 12 receives the stage's analog input. ADC 14 receives the sampled analog voltage from amplifier 12 and converts it to B digital bits. These B digital bits are stored and also input to DAC 16.

DAC 16 re-converts the B digital bits back to an analog voltage that is applied to subtractor 18. Subtractor 18 then subtracts the re-converted voltage from DAC 16 from the sampled analog voltage from sample-and-hold amplifier 12, producing a difference or residue voltage. This residue voltage from subtractor 18 is then multiplied by $2^B$ by amplifier 19. The output voltage from amplifier 19 is thus scaled back up in magnitude for input to the next successive stage 10'.

Each successive stage 10' generates another B digital bits of less significance than earlier stages 10. For example, first stage 10 produces the B most-significant-bits (MSBs), while second stage 10' produces the next B MSB's. The last stage (not shown) produces the final B bits, the least-significant-bits (LSBs). Simple, inexpensive ADCs and DAC's can be used for ADC 14 and DAC 16 when B is just 1 or 2 bits.

Pipelining the ADC's stages allows for higher throughput, since new samples can be taken and converted for every stage in the pipeline. A 10-stage pipeline can operate in parallel on 10 different analog samples at a time. While such an ADC is useful, many stages are needed when higher precision is needed. For example, when B=1 bit per stage, 16-bit precision requires 16 stages 10, 10'. Long pipelines increase delays or latencies until a conversion is completed. The serial pipeline structure increases power, area, and cost for the ADC.

What is desired is an Analog/Digital converter that uses a pipelined structure. A shorter pipeline is desired to reduce latency and cost. It is desired to reduce the pipeline depth by re-using ADC stages. It is desired to recirculate analog signals within a stage of a pipelined ADC. It is desired to use low-precision, low-cost ADC and DAC elements in a stage yet still achieve high overall precision with just a few stages.

SUMMARY OF THE INVENTION

A pipelined recycling Analog-to-Digital Converter (ADC) has an analog sample input that receives an analog sample voltage. A first pipeline stage receives the analog sample voltage. It has an initial converter, a final converter, and a feedback loop that connects an output voltage of the final converter to an input of the initial converter during recycling clock periods.

The first pipeline stage generates more-significant digital bits representing the analog sample voltage and outputs a residue voltage after several of the recycling clock periods. A second pipeline stage receives the residue voltage from the first pipeline stage. It also has an initial converter, a final converter, and a feedback loop that connects an output voltage of the final converter to an input of the initial converter during the recycling clock periods.

The second pipeline stage generates lower-significance digital bits representing the analog sample voltage over several of the recycling clock periods. The initial and final converter each have an analog input that receives an analog voltage, an ADC element that converts the analog voltage to digital bits, and a digital-to-analog converter (DAC) element coupled to the ADC element. It converts the digital bits to an analog DAC voltage. A subtractor receives the analog voltage from the analog input and receives the analog DAC voltage. It generates a difference voltage. A multiplying amplifier increases a scale of the difference voltage to generate an output voltage. Thus the feedback loops in each pipeline stage recycle analog voltages through the initial and final converters over several recycling clock periods.

In further aspects of the invention a sampling switch is coupled between the analog sample input and the analog input of the initial converter in the first pipeline stage. It applies the analog sample voltage to the initial converter in response to a sampling clock before the recycling clock periods. An inter-stage switch is coupled between the first and second pipeline stages. It applies the output voltage from the final converter of the first pipeline stage to the analog input of the initial converter in the second pipeline stage in response to the sampling clock. Thus switches pass sample and residue voltages through the pipeline stages.

In still further aspects a feedback switch applies the output voltage from the final converter to the analog input of the initial converter in a same one of the pipeline stages when the sampling clock is not activating the sampling switch. Thus analog voltages are fed back to the initial converter within a pipeline stage during the recycling clock periods, but samples are passed between stages and not fed back within a pipeline stage when the sampling clock is activating the sampling switch.

In other aspects each pipeline stage has an intermediate switch coupled between the initial and final converters in a pipeline stage. It applies the output voltage from the initial converter to the analog input of the final converter.

In other aspects each of the recycling clock periods includes a PH1 phase and a PH2 phase. The initial converters generate digital bits during the PH1 phase, while the final converters generate digital bits during the PH2 phase. The intermediate switch is closed during the PH2 phase, while the feedback switch is closed during the PH1 phase. Thus the initial and final converters operate in alternate phases of the recycling clock periods.

DETAILED DESCRIPTION

The present invention relates to an improvement in Analog-to-Digital Converters (ADCs). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that latency can be reduced by re-using some of the pipeline stages of a pipelined ADC. The analog voltage output from a stage can be looped back to the stage's input. The stage itself can be composed of two stages rather than just one. This double-staging prevents feed-through and improves timing requirements without additional latches or hold circuits.

The higher throughput from the pipelined architecture is retained, even though the stages are re-used. Doubling of ADC/DAC units in a stage allows phase 1/phase 2 (PH1/PH2) clocking to be used.

Figure 1:
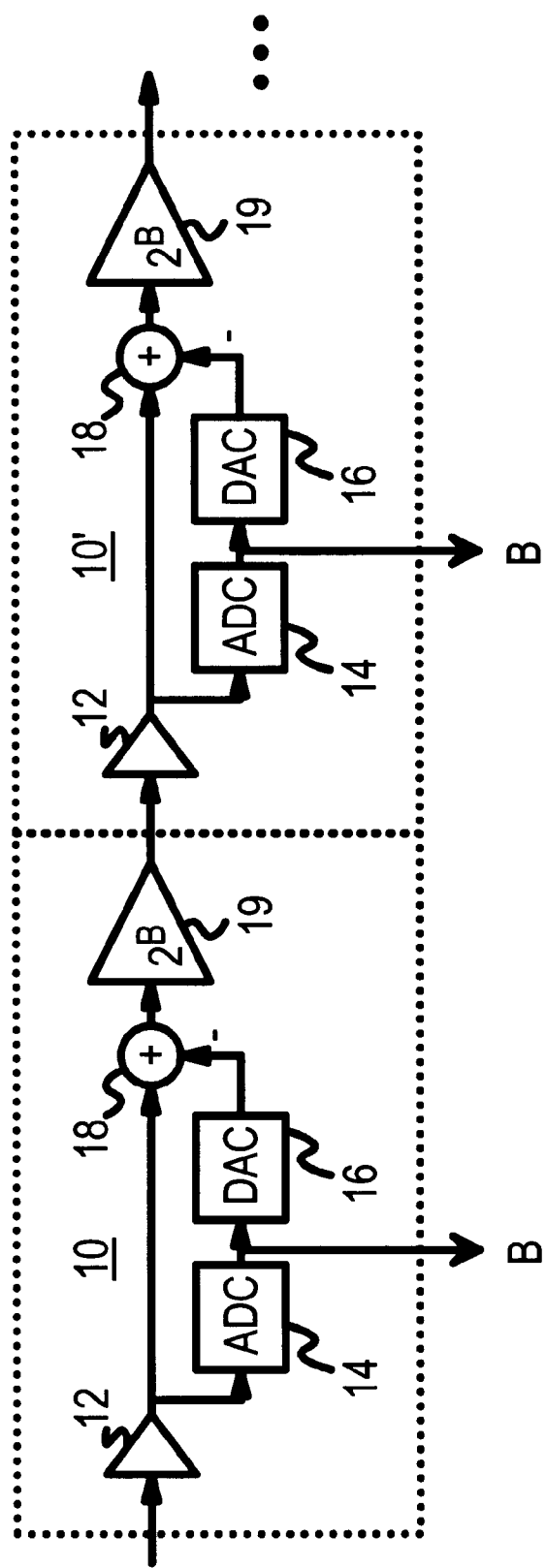
FIG. 1 shows a prior-art pipelined ADC.
Figure 2:
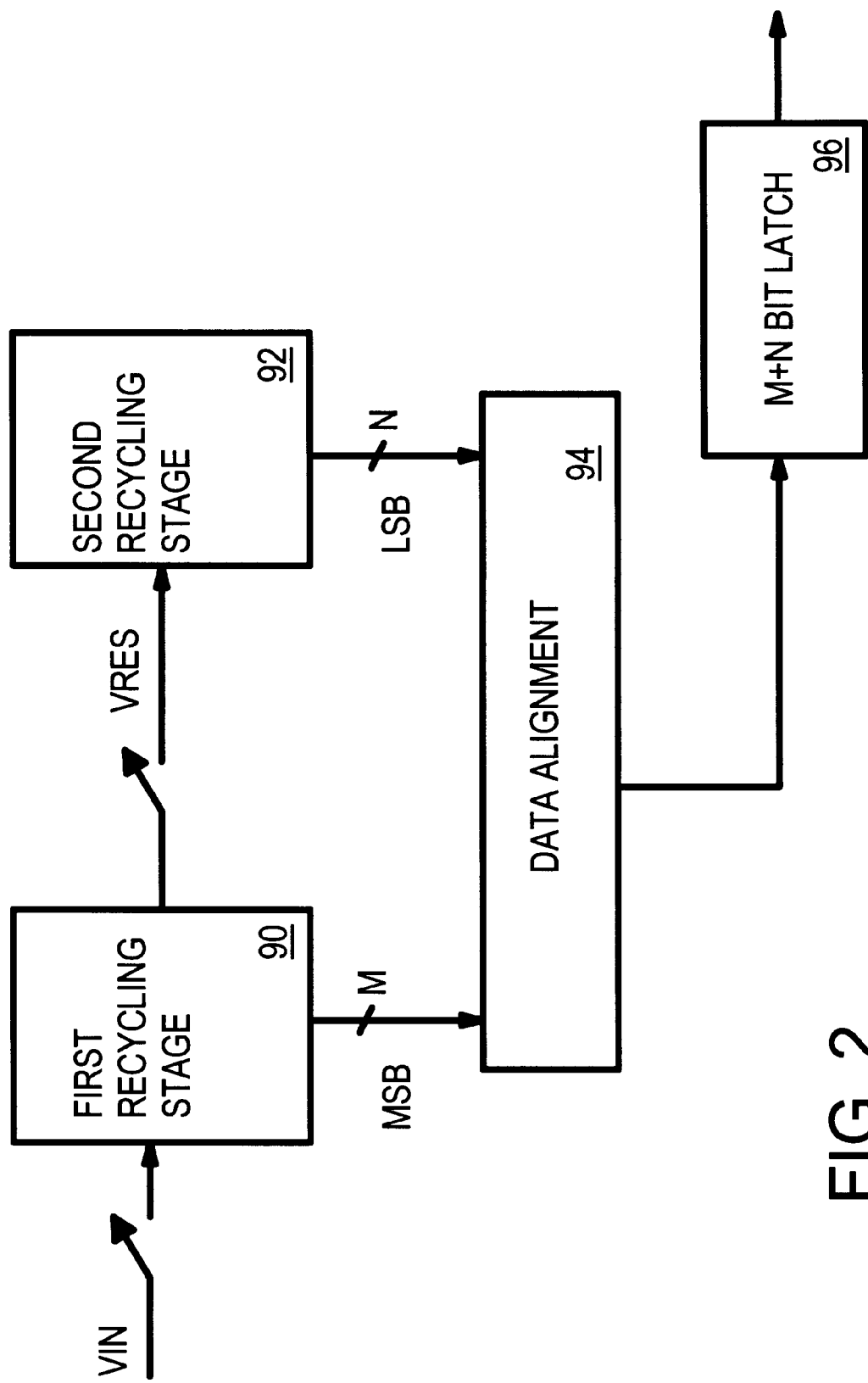
FIG. 2 is a high-level block diagram showing the overall structure of the recycling, parallel ADC.

FIG. 2 is a high-level block diagram showing the overall structure of the recycling, parallel ADC. Two high-level stages 90, 92 are used. First stage 90 receives the analog voltage VIN and generates the most-significant-bits (MSBs). First stage 90 produces a difference of residue voltage that is passed on to second stage 92. Second stage 92 produces the least-significant-bits (LSBs). Data aligner 94 receives MSB bits from first stage 90 and N LSB bits from second stage 92 and aligns the LSB and MSB bits. The LSB bits from second stage 92 are received one pipeline clock period after the MSB bits are received from first stage 90. Both the MSB and LSB bits from data aligner 94 are latched into latch 96 and made available to the system as the M+N-bit digital word that represents the analog voltage VIN.

Each high-level stage 90, 92 contains two traditional ADC/DAC stages rather than just one stage. Each high-level stage 90, 92 contains two sets of ADC/DAC sub-stages. A feedback loop is contained within each high-level stage 90, 92. This feedback loop allows the sets of ADC/DAC sub-stages to be re-used several times before the remaining voltage is sent downstream from MSB stage 90 to LSB stage 92.

The two high-level stages 90, 92 can each operate on a different analog sample at the same time. Thus two analog samples are processed in parallel. Rather than use a linear series of pipeline stages, the ADC uses a nested-stage pipeline structure, where each pipeline stage 90, 92 contains several sub-stages.

Figure 3:
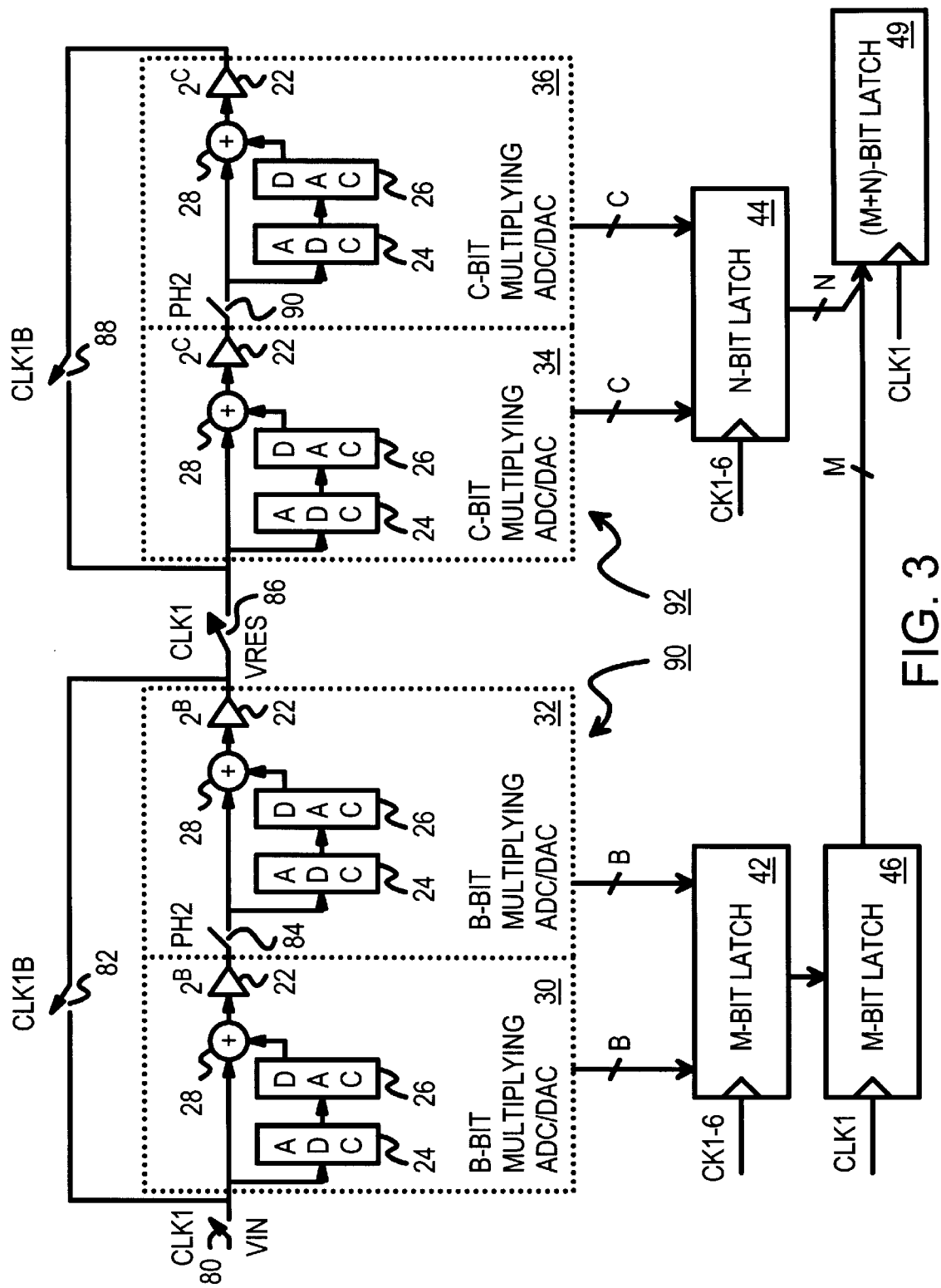
FIG. 3 shows in detail a 2-pipestage recycling ADC where each pipestage contains 2 ADC/DAC sub-stages.

Nested Stage Pipeline—FIG. 3

FIG. 3 shows in detail a 2-pipestage recycling ADC where each pipestage contains 2 ADC/DAC sub-stages. The first high-level stage contains sub-stages 30, 32, while the second high-level stage contains sub-stages 34, 36. Each sub-stage contains one ADC/DAC pair. ADC 24 is a low-precision ADC that compares the analog voltage input to the sub-stage to one or two voltage-reference levels, producing B digital bits for sub-stages 30, 32, or C digital bits for sub-stages 34, 36. B and C may have different values, allowing for differing precisions for the second-stage 92 and first stage 90. In this example, B and C are each 1.5.

DAC 26 is a low-precision digital-to-analog converter (DAC) that converts the B or C digital bits from ADC 24 back to an analog voltage. The analog voltage from DAC 26 is not exactly the same as the analog voltage input to ADC 24, due to a quantization or digitization error. The voltage difference is generated by subtractor 28, which subtracts the voltage produced by DAC 26 from the analog voltage input to ADC 24.

The error or residue voltage from subtractor 28 is then scaled up to a larger voltage by amplifier 22. For sub-stages 30, 32, which each convert B digital bits, amplifier 22 multiplies the residue voltage from subtractor 28 by $2^B$. For sub-stages 34, 36, which each convert C digital bits, amplifier 22 multiplies the residue voltage from subtractor 28 by $2^C$. Since either B or C digital bits are generated by sub-stages 30–36, multiplying amplifier 22 re-scales the relatively small residue voltage back to the full voltage range of ADC 24. Thus full-range input voltages are input to the following stages, even though the digital bits being generated are for successively less-significant bits.

A high-level pipeline clock, CLK1, connects the input analog sample voltage, VIN to the first stage for a new analog sample through switch 80. At the same time, the final residue voltage VRES from sub-stage 32 is transferred through switch 86 to the input of sub-stage 34, transferring the voltage conversion from first stage 90 to second stage 92.

When the pipeline clock CLK1 goes low, CLK1B goes high, closing the feedback switches 82, 88. The residue voltage VRES from second sub-stage 32 is fed back to the analog input of first sub-stage 30 through switch 82, and the residue voltage from last sub-stage 36 is fed back to the analog input of third sub-stage 34 through switch 88. Switches 80, 82, 86, 88 are closed only during the PH1 phase of the clock CLK.

During CLK1B, each high-level stage 90, 92 recirculates the residue voltage. Several PH1 and PH2 clock pulses can occur during each CLK1B phase. During PH1, first and third sub-stages 30, 34 convert the analog voltage to B and C digital bits, respectively. Then when PH2 goes high, the residue voltage from first sub-stage 30 is transferred to the input of second sub-stage 32 through switch 84. Likewise, the residue voltage from third sub-stage 34 is transferred through switch 90 to the input of last sub-stage 36.

During PH2, sub-stages 32, 36 convert the analog residue voltages to B and C additional digital bits. Finally when PH2 goes high, the residue voltage from second sub-stage 32 is transferred to the input of first sub-stage 30 through switch 82, while the residue voltage from last sub-stage 36 is transferred through switch 88 to third sub-stage 34. Thus sub-stages 30, 34 operate during PH1, while sub-stages 32, 36 operate during PH2.

At the end of PH1, B bits converted by ADC 24 in first stage 30 are latched into latch 42, while C bits converted by ADC 24 in third stage 34 are latched into latch 44. At the end of each PH2, another B bits converted by ADC 24 in second stage 32 are latched into latch 42, while another C bits converted by ADC 24 in last stage 36 are latched into latch 44.

For each CLK period, which contains one PH1 pulse and one PH2 pulse, 2B bits are latched into latch 42 and 2C bits are latched into latch 44. Staggered clocks CK1, CK2, CK3, etc. can be generated from CLK and used to latch bits into their proper bit-positions latches 42, 44. Several CLK periods occur before the next CLK1 period, when the first-stage residue voltage is transferred through switch 86 to second stage 92. For Y CLK periods, each stage is re-used Y times, processing the same analog sample for lower and lower significant digital bits. Overall for the Y CLK periods of recirculation, Y*2*B bits are latched into latch 42, while Y*2*C bits are latched into latch 44.

When the pipeline clock CLK1 is pulsed, the digital bits stored in latch 42 are transferred to latch 46. Latch 46 contains the M MSB bits for the sample being converted in second stage 92. Once conversion by second stage 92 is complete, the N LSB bits are stored in latch 44. The final digital word for the sample is formed from the M MSB bits from latch 46 and the N LSB bits from latch 44. The M+N bits can be latched by latch 49 at the next CLK1 pulse.

Figure 4:
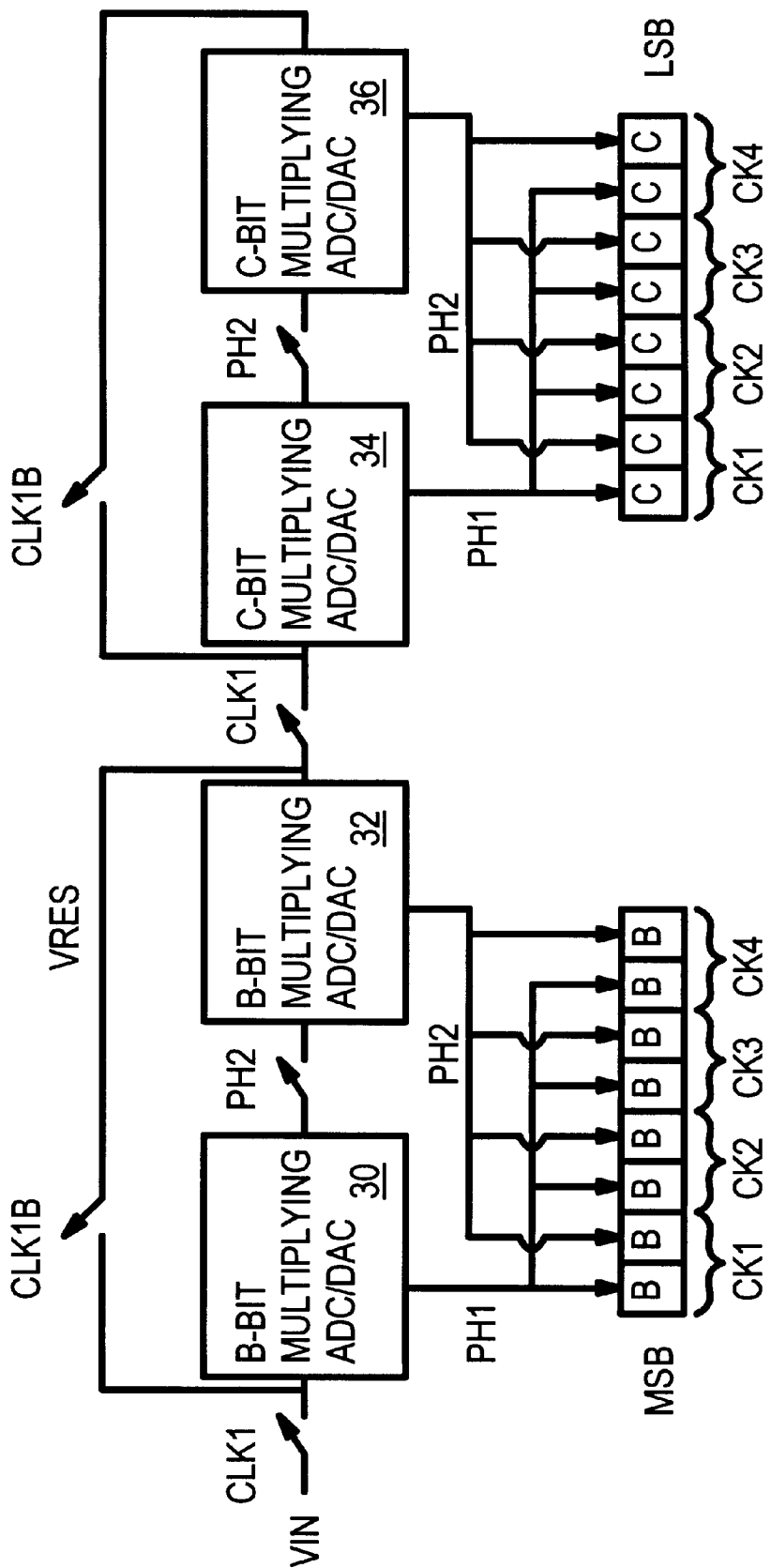
FIG. 4 highlights how digital bits from ADC/DAC sub-stages are aligned to form the digital word.

Data Alignment Over Several CLK Periods—FIG. 4

FIG. 4 highlights how digital bits from ADC/DAC sub-stages are aligned to form the digital word. First sub-stage 30 generates B digital bits during PH1 while second sub-stage 32 generates B digital bits during PH2 of each CLK. Once a new analog voltage VIN is sampled by CLK1, first sub-stage 30 compares it to one or more reference voltages, producing the first B bits, which are the first of the MSB bits. These B bits are latched in on PH1 of the first staggered clock CK1 after the CLK1 pipeline clock. Then during PH2, second sub-stage 32 compares the scaled-up residue voltage from first sub-stage 30 to the voltage reference levels, producing B more digital bits. These are the next B MSB bits and are latched in for PH2 of CK1.

The residue voltage from second sub-stage 32 is scaled up and fed back (recirculated) to first sub-stage 30. Then during PH1 of the next staggered clock, CK2, first sub-stage 30 generates the third group of B MSB bits. These are latched in for PH1 of CK2. In the following PH2 of CK2, second sub-stage 32 generates the fourth B bits of the MSB, which are latched in for PH2 of CK2. The residue from second sub-stage 32 is again fed back to first sub-stage 30, and B more bits are generated for PH1 of CK3. Another B bits are generated for PH2 of CK3. After another residue-voltage feedback, the last B*2 bits of the MSB are generated for PH1 and PH2 of CK4.

A total of B*2*4 MSB bits are generated during the 4 CLK cycles CK1–CK4 by first sub-stage 30 and second sub-stage 32. For B=1 bit, the four clock cycles produced 8 MSB bits. For B=2 bits, 16 MSB bits are produced.

On the next pipeline clock CLK1, the final residue from second sub-stage 32 is passed to third sub-stage 34 in the second stage. A different analog sample can then be converted by first and second sub-stages 30, 32. In the second stage, C digital bits are produced by third sub-stage 34 during each PH1 phase and C more digital bits during each PH2 phase by last sub-stage 36. In CK1, the C most-significant of the LSB bits is produced by third sub-stage 34 during PH2, and the C next-most-significant LSB bits during PH2. In CK2, another C bits are produced in each of PH1 and PH2. CK3 produces another 2*C bits, and the final 2C bits of the LSB, which are the least-significant bits, are produced in CK4.

The total number of digital bits produced in Y CK cycles (and 2 CLK1 cycles) is 2*B*Y+2*C*Y.

The LSB bits represent much smaller voltage intervals than the MSB bits. For a 16-bit ADC, the LSB represents a voltage range that is 64K times smaller than the MSB.

Figure 5:
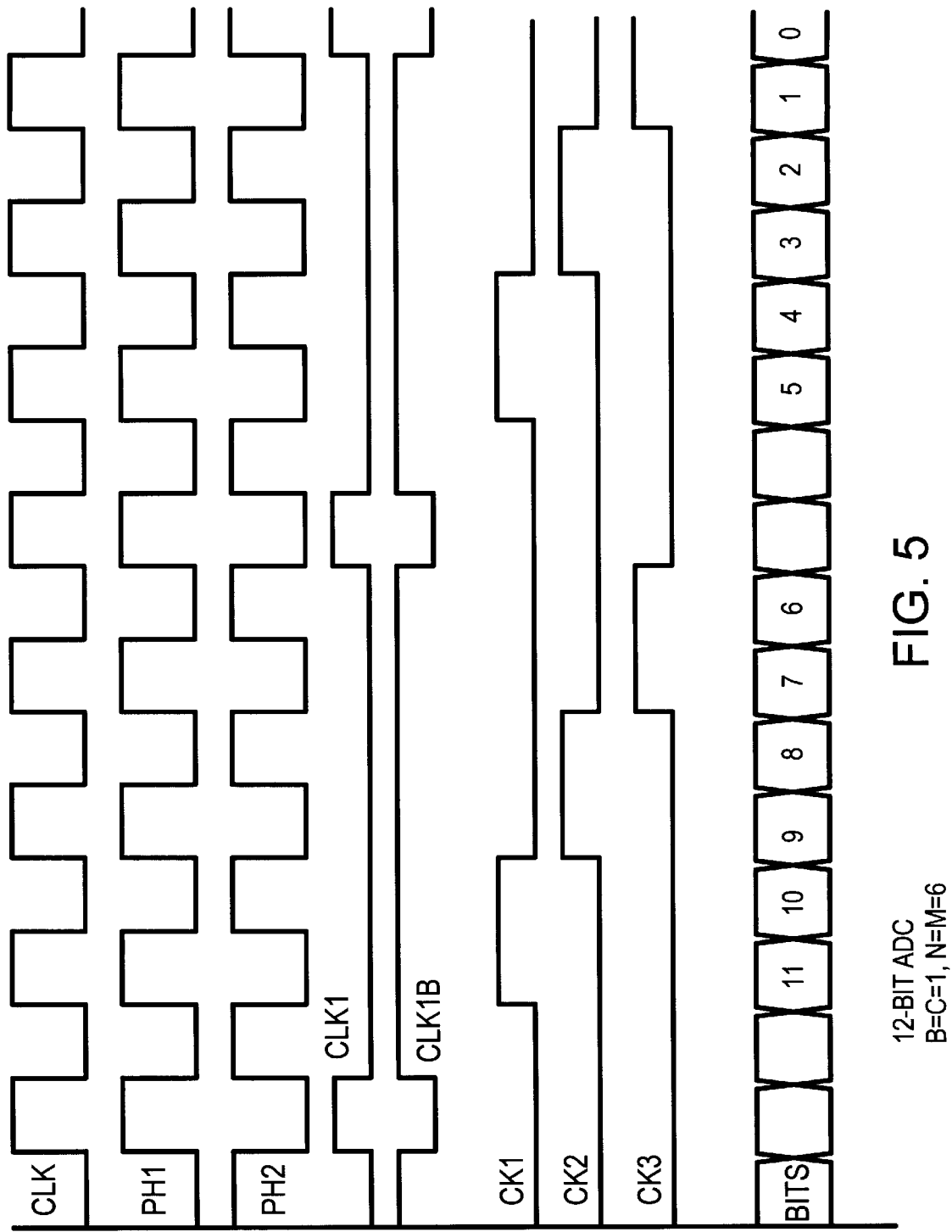
FIG. 5 is a waveform showing the clocking of a 12-bit, 2-stage pipelined recycling ADC.

Timing Waveform—FIG. 5

FIG. 5 is a waveform showing the clocking of a 12-bit, 2-stage pipelined recycling ADC. The example shows a 12-bit ADC with 1-bit sub stages (B=1, C=1). Each high-level stage produces 6 bits (M=8, N=8).

A master clock CLK is used to generate sub-clocks. Every $4^{th}$ pulse of CLK is used to generate a pipeline sampling clock CLK1. When CLK1 is high, an analog voltage is sampled into the first stage, while the final residue voltage from the first high-level stage is transferred to the second high-level stage. When CLK1B goes high, sampling stops and the feedback switches are opened, causing each of the two high-level stages to act as recycling ADC's. CLK1B remains high during the next 3 full CLK periods.

Each CLK period is divided into 2 phases, signaled by non-overlapping clock pulses PH1 and PH2. When PH1 is high, the first and third sub-stages are activated. When PH2 is high, the second and last sub-stages are activated.

FIG. 5 shows one analog sample being converted during two periods of the pipeline clock CLK1. Another sample can be processed simultaneously by the other high-level stage but is not shown for clarity. In the first CLK1/CLK1B period, the first high-level stage converts the analog voltage into bits 11 to 6 of the digital word. The first sub-stage produces bit 11 in PH1 of the second CLK period (CK1 is high), but also produces bits 9, and 7 in the next PH1 phases of the next 2 CLK periods (CK2 and CK3). The second sub-stage produces bit 10 in PH2 of the first CLK period, and also produces bits 8, and 6 in the next PH2 phases of the next 2 CLK periods.

When CLK1 goes high again in the fifth CLK period, the analog residue voltage is passed from the first to the second high-level stages, from the second sub-stage to the third sub-stage. Then in the sixth through eighth CLK periods, bits 5 to 0 are generated in the second high-level stage. These are the LSB bits. The third sub-stage produces bit 5 in PH1 of the sixth CLK period (CK1 is high), but also produces bits 3 and 1 in the next PH1 phases of the next 2 CLK periods (CK2 and CK3). The last sub-stage produces bit 4 in PH2 of the sixth CLK period (CK1), but also produces bits 2 and 0 in the next PH2 phases of the next 3 CLK periods *C2 and CK3).

Of course, while the second high-level stage is generating bits 5–0, the first high-level stage can be generating bits 11–6 of another analog sample. Thus 2 samples can be processed in parallel by the 2 high-level stages.

Figure 6:
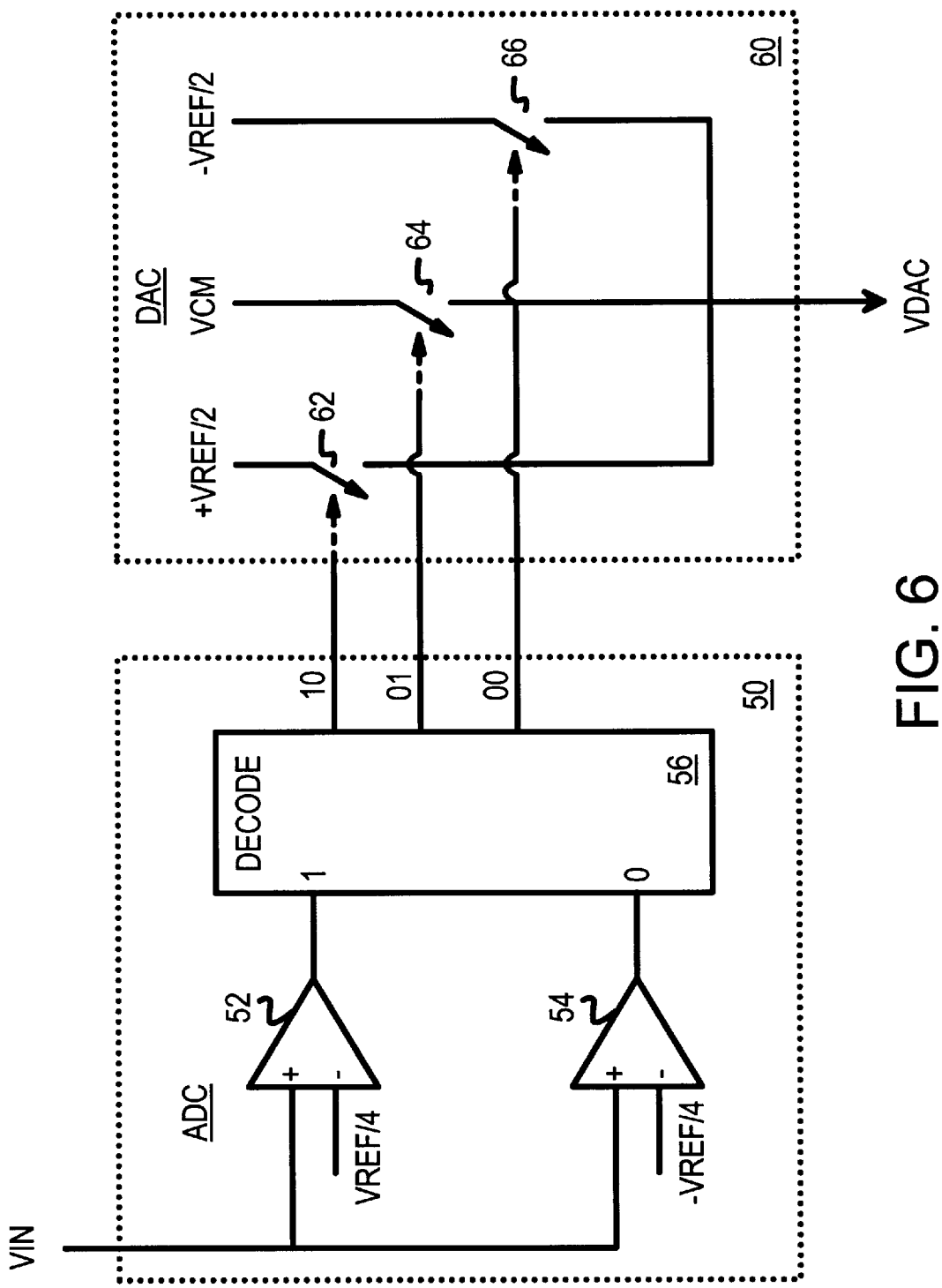
FIG. 6 shows in more detail a sub-stage with a 1.5-bit ADC and DAC.

Sub-stage—FIG. 6

FIG. 6 shows in more detail a sub-stage with a 1.5-bit ADC and DAC. A simple 1-bit ADC could be implemented by comparing the analog voltage to a single voltage level. However, a 1.5-bit ADC that compares the analog voltage to a pair of reference-voltage levels is preferred. The additional 0.5-bit ADC resolution provides error correction capabilities and improves the signal-to-noise ratio. The extra half-bit (0.5 bit) is redundant and does not provide additional data. The half bit overlaps with the half bit of the next stage so the effective number of bits from the ADC is the same as B=1. The multiplier multiplies by 2 (2^1).

ADC 50 receives an analog input voltage VIN, which is applied to the non-inverting inputs of op amps 52, 54. A reference voltage VREF is generated above a mid-level voltage VCM of 0 volts, and a reference of −VREF is generated below VCM. VREF is voltage-divided to generate VREF/4, while −VREF/4 is also generated. VREF/4 is applied to the inverting input of op amp 52, while −VREF/4 is applied to the inverting input of op amp 54.

The output of op amp 52 is high when the input voltage VIN is above VREF/4, while the output of op amp 54 is high when input voltage VIN is above −VREF/4. Decoder 56 receives the outputs of comparators 52, 54, and generates control signals. When VIN is above both VREF/4 and −VREF/4, a 10 condition, then switch 62 is closed, driving the DAC output voltage VDAC with VREF/2. When VIN is between VREF/4 and −VREF/4, decoder 56 closes switch 64. The mid-range voltage VCM is applied to VDAC. When VIN is below −VREF/4, decoder 56 closes switch 66, applying −VREF/2 to VDAC.

Since op amps 52, 54 compare VREF/4 while half-signal VREF levels (+/−VREF/2) are output as VDAC, DAC 60 effectively amplifies or multiplies the DAC voltage by 2. The DAC voltage VDAC output from DAC 60 is then multiplied by 2 and applied to the subtractor before the difference voltage is applied to the multiplying amplifier.

Advantages of the Invention

An Analog/Digital converter uses a nested pipelined structure. A shorter pipeline results, reducing latency and cost. The pipeline depth is reduced by re-using ADC stages. Analog signals are recirculated within a pipeline stage of the pipelined ADC. Each pipeline stage contains 2 or more pairs of ADC/DAC's. Low-precision, low-cost ADC and DAC elements can be used in a stage while still achieving high overall precision with just a few stages.

The second stage can have a lower accuracy than the first stage. For a 16-bit ADC, the first-stage must have an error of less that $2^{-16}$, while the second stage needs an accuracy of only $2^{-8}$. Since the first stage has already converted 8 of the 16 bits, the voltage residue passed from the first stage to the second stage has a precision of only 8 bits, not 16 bits. Thus while high-precision components such as capacitors must be used for the first stage, the second stage can be constructed with lower-precision components. Since capacitor and op amp accuracy often depend on their sizes, smaller capacitors and op amps can be used in the second stage, reducing power and area requirements.

Alternate Embodiments

Several other embodiments are contemplated by the inventors. For example the ADC and DAC elements can be implemented in many ways, such as with op amps and capacitor switching. Different resolutions of the ADC/DAC pairs in the sub-stages can be used, and different numbers of clock cycles and bits generated by each high-level stage can be substituted. More high-level stages can be added beyond the two described, and more sub-stages can be used.

The second stage can stop conversion early, after only two or three clock cycles, when fewer LSB bits are needed. In one embodiment, M=7 and N=5, where only 5 bits are generated by the LSB stage while 7 bits are generated by the MSB (first) stage. The second stage finishes conversion one clock before the first stage does, allowing time for the results to the latched. Other buffers and amplifiers can be added, such as a input buffer or sample-and-hold buffer for each stage or sub-stage.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A pipelined recycling Analog-to-Digital Converter (ADC) comprising:
   an analog sample input receiving an analog sample voltage;
   a first pipeline stage, receiving the analog sample voltage, having:
      an initial converter;
      a final converter; and
      a feedback loop that connects an output voltage of the final converter to an input of the initial converter during recycling clock periods,
      the first pipeline stage generating more-significant digital bits representing the analog sample voltage and outputting a residue voltage after several of the recycling clock periods;
   a second pipeline stage, receiving the residue voltage from the first pipeline stage, having:
      an initial converter;
      a final converter; and
      a feedback loop that connects an output voltage of the final converter to an input of the initial converter during the recycling clock periods,
      the second pipeline stage generating lower-significance digital bits representing the analog sample voltage over several of the recycling clock periods;
   wherein the initial and final converter each comprise:
      an analog input receiving an analog voltage;
      an ADC element for converting the analog voltage to digital bits;
      a digital-to-analog converter (DAC) element, coupled to the ADC element, for converting the digital bits to an analog DAC voltage;
      a subtractor, receiving the analog voltage from the analog input and receiving the analog DAC voltage, for generating a difference voltage; and
      a multiplying amplifier for increasing a scale of the difference voltage to generate an output voltage;
   whereby the feedback loops in each pipeline stage recycle analog voltages through the initial and final converters over several recycling clock periods.

2. The pipelined recycling ADC of claim 1 further comprising:
   a sampling switch, coupled between the analog sample input and the analog input of the initial converter in the first pipeline stage, for applying the analog sample voltage to the initial converter in response to a sampling clock before the recycling clock periods;
   an inter-stage switch, coupled between the first and second pipeline stages, for applying the output voltage from the final converter of the first pipeline stage to the analog input of the initial converter in the second pipeline stage in response to the sampling clock, whereby switches pass sample and residue voltages through the pipeline stages.

3. The pipelined recycling ADC of claim 2 wherein the feedback loops each include:

a feedback switch, for applying the output voltage from the final converter to the analog input of the initial converter in a same one of the pipeline stages when the sampling clock is not activating the sampling switch;

whereby analog voltages are fed back to the initial converter within a pipeline stage during the recycling clock periods, but samples are passed between stages and not fed back within a pipeline stage when the sampling clock is activating the sampling switch.

4. The pipelined recycling ADC of claim 3 wherein each pipeline stage further comprises:

an intermediate switch, coupled between the initial and final converters in a pipeline stage, for applying the output voltage from the initial converter to the analog input of the final converter.

5. The pipelined recycling ADC of claim 4 wherein each of the recycling clock periods includes a PH1 phase and a PH2 phase, wherein the initial converters generate digital bits during the PH1 phase, while the final converters generate digital bits during the PH2 phase, wherein the intermediate switch is closed during the PH2 phase, while the feedback switch is closed during the PH1 phase, whereby the initial and final converters operate in alternate phases of the recycling clock periods.

6. The pipelined recycling ADC of claim 1 wherein the more-significant digital bits representing the analog sample voltage are generated over several of the recycling clock periods by the ADC and DAC elements of the first pipeline stage, before the lower-significance digital bits representing the analog sample voltage are generated over another several of the recycling clock periods by the ADC and DAC elements of the second pipeline stage after the residue voltage is passed from the first pipeline stage to the second pipeline stage, whereby the first pipeline stage first generates the more-significant digital bits, then the second pipeline stage generates the lower-significance digital bits.

7. The pipelined recycling ADC of claim 6 wherein the first pipeline stage receives a different analog sample voltage and generates a different group of more-significant digital bits while the second pipeline stage is generating the lower-significance digital bits for the analog sample voltage processed by the first pipeline stage in a previous group of the recycling clock periods, wherein the initial and final converters in the second pipeline stage have an accuracy of about half of the accuracy of the initial and final converters in the first pipeline stage, whereby two of the analog sample voltages are processed in parallel.

8. The pipelined recycling ADC of claim 7 further comprising:

a pipeline latch for storing the more-significant digital bits generated by the first pipeline stage, for combining with the lower-significance digital bits generated by the second pipeline stage during a following series of the recycling clock periods, whereby the more-significant digital bits are generated early and latched.

9. The pipelined recycling ADC of claim 8 wherein B digital bits are latched into the pipeline latch from the initial converter of the first pipeline stage during a first phase of each recycling clock period, while B digital bits are latched into the pipeline latch from the final converter of the first pipeline stage during a second phase of each recycling clock period, whereby 2*B digital bits are accumulated in the pipeline latch for each recycling clock period.

10. The pipelined recycling ADC of claim 9 wherein the initial converter and the final converter each output B digital bits for each clock period, wherein B is at least 1, wherein the first pipeline stage generates 2*B digital bits and the second pipeline stage generates 2*B digital bits during each of the recycling clock periods.

11. The pipelined recycling ADC of claim 1 wherein the multiplying amplifier increases the scale of the difference voltage by a power of $2^B$, wherein B is a number of digital bits produced by the initial or final converter, whereby analog difference voltages are scaled up between the initial and final converters.

12. A nested-pipeline Analog-to-Digital Converter (ADC) comprising:

a first recycling stage for converting an analog input voltage to most-significant bits (MSBs), the first recycling stage generating a final residue voltage representing a difference between the analog input voltage and a voltage represented by the MSBs;

a second recycling stage for converting the final residue voltage from the first recycling stage to least-significant bits (LSBs);

the first recycling stage having:

an initial sub-stage, having an analog input, for generating B digital bits of the MSB, the initial sub-stage having an ADC element and a DAC element, the ADC element converting the analog input to the B digital bits, the DAC element re-converting the B digital bits to a DAC voltage, the initial sub-stage outputting an intermediate voltage;

a final sub-stage, receiving the intermediate voltage from the initial sub-stage, for generating B digital bits of the MSB of less significance that the B digital bits generated by the initial sub-stage, the final sub-stage having an ADC element and a DAC element, the ADC element converting the intermediate voltage to the B digital bits, the DAC element re-converting the B digital bits to a DAC voltage, the final sub-stage outputting a final voltage;

a feedback switch for coupling the final voltage from the final sub-stage to the analog input voltage of the initial sub-stage during recycling clock periods;

a sampling switch, for connecting the analog input voltage to the analog input of the initial sub-stage during sampling clock periods;

the second recycling stage having:

an initial sub-stage, having an analog input, for generating C digital bits of the LSB, the initial sub-stage having an ADC element and a DAC element, the ADC element converting the analog input to the C digital bits, the DAC element re-converting the C digital bits to a DAC voltage, the initial sub-stage outputting an intermediate voltage;

a final sub-stage, receiving the intermediate voltage from the initial sub-stage, for generating C digital bits of the LSB of less significance that the C digital bits generated by the initial sub-stage, the final sub-stage having an ADC element and a DAC element, the ADC element converting the intermediate voltage to the C digital bits, the DAC element re-converting the C digital bits to a DAC voltage, the final sub-stage outputting a final voltage;

a second feedback switch for coupling the final voltage from the final sub-stage to the analog input voltage of the initial sub-stage during the recycling clock periods; and a second sampling switch, for connecting the analog input voltage to the analog input of the initial sub-stage during the sampling clock periods, whereby the first and second recycling stages, each containing sub-stages, is an ADC with a nested pipeline structure.

13. The nested-pipeline ADC of claim 12 wherein:

the second recycling stage has a lower accuracy than the first cycling stage, and an analog sample voltage is sampled by the first recycling stage during a first sampling clock period, the first recycling stage generating 2*B digital bits of the MSB during each successive recycling clock period, the first recycling stage transferring the final voltage to the second recycling stage during a second sampling clock period, the second recycling stage generating 2*C digital bits of the LSB during successive recycling clock periods, whereby the analog sample voltage is converted over several clock periods by the first and second recycling stages.

14. The nested-pipeline ADC of claim 13 wherein during at least one of the recycling clock periods the first recycling stage generates 2*B digital bits but the second recycling stage does not produce any LSB bits, the second recycling stage being idle, wherein more MSB bits are generated than LSB bits during the recycling clock periods, whereby conversion by the first and second recycling stages is asymmetric.

15. A parallel-recycling Analog-to-Digital Converter (ADC) comprising:

sampling means, receiving an analog sample, for periodically sampling the analog sample to generate an analog-sample input voltage;

first recycling means, receiving the analog-sample input voltage during a sample period of a clock, for recycling analog voltages and generating digital bits representing lower-significance residues of the analog sample over a plurality of recycling periods of the clock that are not the sample period, the first recycling means outputting a final residue voltage at a next sample period after the plurality of recycling periods;

second recycling means, receiving the final residue voltage during the sample period of the clock, for recycling analog voltages and generating digital bits representing lower-significance residues of the analog sample over a plurality of recycling periods of the clock;

wherein the digital bits generated by the first recycling means represent most-significant-bits (MSBs) of the analog-sample input voltage, while digital bits generated by the second recycling means represent least-significant-bits (LSBs) of the analog-sample input voltage processed by the first recycling means during a previous plurality of the recycling periods of the clock;

whereby the first and second recycling means are pipelined.

16. The parallel-recycling ADC of claim 15 wherein the first and second recycling means each comprise:

initial converter means for converting an analog voltage to digital bits;

final converter means for converting an analog voltage to digital bits; and feedback means for feeding an analog voltage back to the initial converter means;

wherein the initial and final converter means each comprise:

low-resolution ADC means, receiving an analog voltage input to the converter means, for generating digital bits that coarsely represent the analog voltage;

low-resolution digital-to-analog converter (DAC) means, coupled to the low-resolution ADC means, for generating a DAC voltage that exactly represents the digital bits generated by the low-resolution ADC means;

subtractor means, receiving the DAC voltage, for generating a difference voltage; and scaling means, receiving the difference voltage, for generating a scaled residue voltage for input to a next converter, whereby each recycling means includes a series of low-resolution ADC and DAC means.

17. The parallel-recycling ADC of claim 16 further comprising:

inter-stage switch means, coupled between the first and second recycling means, for transferring the final residue voltage from the first recycling means to the second recycling means in response to the sample period of the clock.

18. The parallel-recycling ADC of claim 17 wherein the low-resolution ADC means comprises:

a first op amp means, receiving a first reference voltage and receiving the analog voltage input, for determining when the analog voltage input is above the first reference voltage;

a second op amp means, receiving a second reference voltage and receiving the analog voltage input, for determining when the analog voltage input is above the second reference voltage;

decoder means, coupled to the first and second op amp means, for generating control signals to the low-resolution DAC means, whereby the low-resolution ADC means compares the analog voltage input to two reference levels.

19. The parallel-recycling ADC of claim 18 wherein the low-resolution DAC means connects:

a scaled first reference voltage to the subtractor means as the DAC voltage when the first op amp means signals that the analog voltage input is above the first reference voltage;

a scaled second reference voltage to the subtractor means as the DAC voltage when the second op amp means signals that the analog voltage input is not above the second reference voltage; or a mid-reference voltage to the subtractor means as the DAC voltage when the first op amp means signals that the analog voltage input is not above the first reference voltage and the second op amp means signals that the analog voltage input is not above the second reference voltage;

wherein the mid-reference voltage is between the scaled first reference voltage and the scaled second reference voltage;

whereby signal levels are scaled by the low-resolution DAC means to improve noise immunity.

20. The parallel-recycling ADC of claim 19 wherein the decoder means generates one of 3 possible states of the first and second op amp means, whereby 1.5 digital bits are generated by the low-resolution ADC means.

* * * * *